United States Patent [19]

Rosini

[11] Patent Number: 4,609,999
[45] Date of Patent: Sep. 2, 1986

[54] RAM MEMORY CELL WITH ELECTRICALLY PROGRAMMABLE NON-VOLATILE MEMORY ELEMENT

[75] Inventor: Paolo Rosini, Monza, Italy

[73] Assignee: SGS-ATES Componenti Elettronici S.p.A., Catania, Italy

[21] Appl. No.: 572,453

[22] Filed: Jan. 20, 1984

[30] Foreign Application Priority Data

Jul. 27, 1983 [IT] Italy ............................... 22256 A/83

[51] Int. Cl.$^4$ .......................... G11C 11/40; G11C 7/00
[52] U.S. Cl. ..................................... 365/154; 365/95; 365/227
[58] Field of Search ................. 365/95, 184, 185, 189, 365/227, 154

[56] References Cited

U.S. PATENT DOCUMENTS

| | | | |
|---|---|---|---|
| 4,132,904 | 1/1979 | Harari | 365/185 |
| 4,158,237 | 6/1979 | Wiedmann | 365/154 |
| 4,207,615 | 6/1980 | Mar | 365/95 |
| 4,388,704 | 6/1983 | Bertin et al. | 365/185 |

Primary Examiner—James W. Moffitt
Assistant Examiner—Glenn A. Gossage
Attorney, Agent, or Firm—Cushman, Darby & Cushman

[57] ABSTRACT

The cell is realized according to a bistable structure which includes a non-volatile memory element. During the normal operation the structure operates as a static RAM cell with the non-volatile element excluded from the circuit. In case of turn-off of the supply line or after suitable control signals, a particular circuit arrangement allows to execute the programming operation of the non-volatile element, that is the information storage, without current absorption. At the turn-on, the automatic reinstatement of the stored information occurs.

5 Claims, 1 Drawing Figure

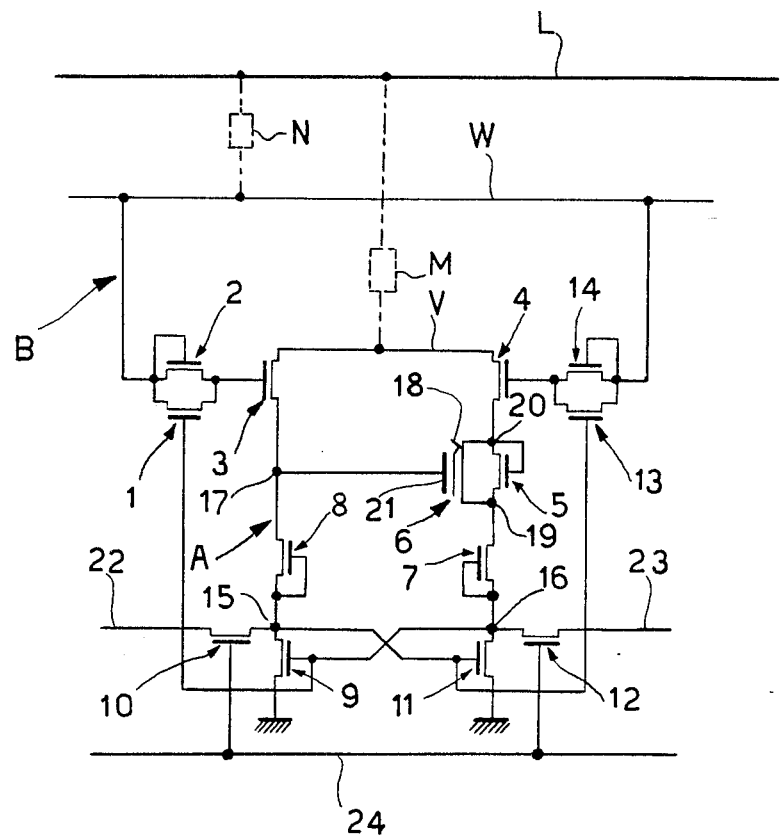

RAM MEMORY CELL WITH ELECTRICALLY PROGRAMMABLE NON-VOLATILE MEMORY ELEMENT

The present invention relates to a RAM memory cell, which includes an electrically programmable non-volatile memory element.

In some applications, it is necessary to retain the information stored in a RAM memory cell, when the electric line feed is interrupted, or in any case after the operation of suitable control devices.

This function can be realized, after a line voltage fall has been revealed, by retaining a given electric charge, for example by means of a capacitive element, for a long enough time to allow the transfer and the storage of the information in a suitable non-volatile memory element.

RAM cells provided with non-volatile memory element are already known, for example from the U.S. Pat. No. 4,207,615, but they are not quite satisfactory, primarily because they require too high programing currents, not compatible with uses in circuits with low supply voltage and consequently limited capacity of current delivery, through inner multipliers, at the high voltages requested by the non-volatile elements.

The object of the present invention is to realize a RAM memory cell, provided with electrically programmable non-volatile memory element, in which the programming operation can occur without notable current absorption.

According to the invention such an object has been realized by means of a RAM cell memory, comprising a bistable circuit with two interconnected branches, alternatively conducting and non-conducting, one of said branches including a non-volatile memory element which is programmable in one or the other of two different electric states according to the state in which said bistable circuit is at the moment of the turn-off of the line supply, or when suitable control devices are operated, and also able to cause the reinstatement of said state of the bistable circuit at the moment of the new turn-on of said line supply, characterized in that each branch of said bistable circuit also includes a control switch element which in turn controlled by the state of said supply and by that of the other branch of the bistable circuit so that the turn- off of said line supply allows the non-conducting branch of the bistable circuit to cause the interdiction of the conducting branch of the same bistable circuit for the consequent programming of said non-volatile memory element without current absorption.

BRIEF DESCRIPTION OF THE DRAWING

An embodiment of the memory cell according to the invention is illustrated for better clarity in the enclosed drawing, which shows its detailed diagram.

With reference to the drawing, there is illustrated a non-volatile random access memory (RAM), realized with metal-oxide-semiconductor (MOS) technology.

The circuit of the above mentioned cell is substantially composed by two parts A and B, the first one of which defines a bistable circuit with non-volatile memory element and the second one is intended for the commutation from the condition of normal bistable operation to that of programming of the non-volatile element (with consequent storage of the information relative to the state of the bistable circuit and then to that of reinstatement of the stored information).

The bistable circuit, that is the part A, comprises as usual two interconnected circuit branches, which extend between a supply line V and ground. One of the branches includes a series of the transistors 3, 8 and 9, the second one of which is of "depletion" kind and constitutes one of the load transistors of the bistable circuit, while the third one constitutes one of the driver transistors of the same circuit; the transistor 3 on the other hand operates as control transistor in the programming step, as it will be explained later on. The other branch of the bistable circuit includes in a series of the transistors 4, 5, 7 and 11, the first, the third and the fourth of which respectively correspond to the transistors 3, 8 and 9 of the other branch, with which an interconnection of bistable kind is realized thanks to the crossed connections between the gate of the transistor 9 and a circuit node 16 interposed between the transistors 7 and 11 of the other branch and between the gate of the transistor 11 and a circuit node 15 interposed between the transistors 8 and 9 of the opposite branch. It is however to be noted that the length of the transistor 7 is about half of that of the transistor 8, so that the above mentioned transistor 7 is inclined to set in its own branch a current of double value with respect to the other branch. Furthermore, the transistor 11 is longer than the transistor 9, so that with equal "gate" voltage and "drain" current it will have a "drain" voltage higher than that of the transistor 9. This asymmetry does not disturb the working of the bistable circuit, but influences the positioning of the same at the moment of turn on, as it will be explained later on.

The transistor 5, of "enhancement" kind, has connected in parallel between the "drain" node 20 and the "source" node 19, an electrically programmable non-volatile memory element 6, which is illustrated by way of example of the kind with "floating gate" 18 and "programming gate" 21 connected to an intermediate node 17 between the transistors 3 and 8 of the opposite circuit branch. More precisely, the non-volatile memory element 6 can be considered as constituting by way of example, a transistor of the kind illustrated in the U.S. Pat. No. 4,203,158, that is based on the presence of a very thin layer (100 Å) of silicon oxide interposed between the "drain" 20 and the "floating gate" 18, the layer having the capacity of becoming conductive and then charging (positively or negatively) the "floating gate" 18 if submitted to an electric field of suitable intensity (effect Fowler-Nordheim). The charge of the "floating gate" 18 is dependent on if the non-volatile element 6 being more or less able to short-circuit the transistor 5, with the effects which will be explained later on. When not short-circuited, however transistor 5 does not influence the bistable operation with its voltage drop, but it only lowers the high voltage level (logic level "one") present at the node 16.

The commutation controls are given to the bistable circuit by "bit lines" 22 and 23 through respective transistors 10 and 12 with "gates" controlled by a "word line" 24.

The part B or programming or precharge part of the RAM cell includes two pairs of parallel connected transistors 1-2 and 13-14 interposed between the "gates" of the transistors 3 and 4 and a programming or percentage line W. The "gates" of the transistors 1 and 13 are connected to the "gates" of the "driver" transistors 9 and 11, respectively, of the bistable circuit. The transistors 2 and 14 are of "enhancement" kind and have their "gates" connected to the respective "drain" electrodes.

Between the supply line V and the programming or precharge line W, on one hand, and the main supply line L, the other hand, there are interposed devices of various kind M and N, which function to modify the voltage levels of the lines V and W according to the state of the main line L. More precisely, in conditions of normal voltage on the line L, therefore in the normal state of operation of the RAM cell as a static cell, the line W carries a voltage of about 18V and the line V carries a voltage of about 5V. In case of turnoff of the main line L, or in any case when it is desired to effect the programming operation, however, the voltage of the line W falls to 0V, while that of line V momentarily rises to about 20V, keeping such value at least for about 10 ms and then eventually falling to 0V.

The devices M and N are conventional elements for accomplishing the functions just described. For example. device N may be a transistor inserted between line W and ground. The transistor is controlled by the voltage on the supply line L so that when the voltage on line L drops, the transistor responds to drop the voltage to ground level. The device M, on the other hand, may take the form of a capacitor connected between lines L and V, the capacitor being charged by supply line L when it is at its high voltage so that when the voltage on line L drops to zero, line V is caused to initially rise to the voltage level of the charged capacitor and then the voltage on line V falls as the charge on the capacitor decays.

From all of this there derives the following working of the non-volatile RAM cell illustrated in the drawing.

In normal conditions of bistable operation, the 18V voltage of the line W is applied to the gates of the transistors 3 and 4 with a drop of about 2V due to the transistors 2 and 14 (of enhancement kind). The resulting voltage of 16V makes the transistors 3 and 4 extremely conductive, thereby essentially acting as short-circuits connecting the line V (at 5V) to the electrodes 21 and 20 of the non-volatile transistor 6. Under this condition the circuit operates in the usual bistable way, not influenced, as already stated, by the presence of the transistor 5.

In case of turn-off of the line voltage L, or owing to suitable controls imparted to the outer control devices M and N, storage of information relative to the state of the bistable circuit occurs, the so called "programming" of the non-volatile memory element 6.

The fall of the line voltage L, or a suitable control imparted to the devices M and N, causes the corresponding fall of the voltage of the programming line W and, immediately after, the momentary rising of the voltage of the supply line V. According to the electric state which the bistable circuit is in (that is the branch 7–11 non-conducting and consequently the node 16 at high level and the branch 8–9 in conduction and consequently the node 15 at low level, or viceversa), one of the transistors 1–13 has its gate at high level while the other one has its gate at low level, that is one is conducting and the other one is non-conducting. It follows that one of the transistors 3–4 has its gate connected to ground (voltage O of the line W) through the conducting one of the two transistors 1–13, and therefore is non-conducting, while the other one substantially keeps its gate charge (thanks to the gate capacity of the same transistor and to the diffusion capacity associated with the relative circuit node), and therefore conducts. The transistors 2 and 14 do not influence this behaviour, as they have a gate-source voltage equal to 0 and operate as reverse diodes. Both branches 3-8-9 and 4-7-11 are therefore interdicted and consequently no current absorption occurs from line V, now at about 20V.

In this condition, the programming operation of the non-volatile memory element 6 occurs as follows.

If at the moment of the supply turn-off the bistable circuit was in the state with the branch 4-7-11 interdicted and the branch 3-8-9 in conduction, the programming gate 21 of the non-volatile element, connected to the node 17, is at ground potential, while the drain electrode 20 of the same non-volatile element rises with the potential of the line V thanks to the conduction assured to the transistor 4 by maintenance of the gate voltage of said transistor at a high value. As a result, if the floating gate of the non-volatile element 6 has been previously negatively charged, current passage occurs from 20 to 18, which positively charges the floating gate 18; if, on the other hand, the latter has already been positively charged, everything remains as before, that is there does not occur any passage of current. This is very important because it limits the ageing phenomenon of the non-volatile element, which results every time the kind of conductivity is changed with consequent passage of charges through the thin oxide.

If, at the moment of the supply turn-off, the bistable circuit was in the state with the branch 4-7-11 in conduction and the branch 3-8-9 interdicted, the programming gate 21 of the non-volatile element 6 rises to the potential of the line V through the transistor 3 (in such case in conduction), while the drain 20 of the same non-volatile element falls to ground potential through the transistors 7 and 11. As a consequence, the floating gate 18 negatively charges, if not already charged, by passage of current between the same gate 18 and the drain 20.

In conclusion, according to the state of the bistable circuit, the non-volatile element 6 puts itself with positive or negative charge on the floating gate 18, as already stated without current absorption and without a compulsory change of charge and conductivity (as it would happen, if it was necessary, as in some examples of prior art, to preliminarily annul the previous charge condition).

The charge condition assumed by the non-volatile element 6, that is on its programming as a function of the state of the bistable circuit, depends on the restoration of the same state at the moment of the turn-on. If the charge on the floating gate 18 is positive, in fact, the non-volatile element 6 short-circuits the transistor 5, assuring the load transistor 7 a higher current which, by combining with the greater length (and consequently greater resistivity) of the transistor 11, causes the voltage level of the node 16 to rise before that of the node 15; consequently, the bistable circuit returns to the initial state with the branch 8–9 in conduction and the branch 7–11 interdicted. If, on the other hand, the charge stored in the programming step on the floating gate 18 is negative, the transistor 5 is not short-circuited by the non-volatile transistor 6 and, by turning on with slight delay (necessary to allow the voltage to pass from the drain 20 to the source 19), the voltage of the node 15 is allowed to rise more quickly than that of the node 16; the bistable circuit thus returns to the initial state with the branch 7–11 inconduction and the branch 8–9 interdicted.

It has already been said that the main advantage of the non-volatile RAM cell according to the invention consists in the absorption of current equal to 0 (or about zero) in the programming step. From this derives, inter alia, the possibility of using the cell also in combination with devices, such as voltage multipliers, with low supply voltage and consequently with limited capacity of current delivery. It is also possible to use the cell, together with other suitable control circuits, in such a way as to effect the programming step of the non-volatile element after the element of the supply line, by using, in view of the near zero consumption of the cell, the charge stored in a properly precharged condenser of low value. This was not possible with the previously known art, since it was necessary to keep the supply line high for the time necessary to make the programming operation.

It also has been explained that since preliminary clearing of the non-volatile memory element is not necessary, the charge change is required only in case of commutation from one state to the other, so that the ageing phenomenon is limited.

Finally, as the group 5-6 in the circuit illustrated in the drawing is outside the bistable circuit, the voltage between the drain 20 and the programming gate 21 of the non-volatile element 6, and consequently the state of the latter, is not influenced by the bistable state.

The working is thus more exact and sure.

I claim:

1. A memory cell comprising:
   a voltage supply line;
   first and second circuit portions interconnected to form a bistable circuit, the circuit portions normally being alternately conducting and non-conducting;
   a control switch element in each of said circuit portions, said elements being joined to the supply line;
   a non-volatile memory element also included in one of the circuit portions and operably connected to said control switch elements whereby when voltage to said supply line is interrupted or when suitable control devices are operated, the control switch element in the then conducting circuit portion is rendered non-conductive and the memory element is caused to be programmed in one or the other of two electrical states, the state of programming being a function of whichever of the circuit portions was conducting immediately prior to commencement of programming, said programmed memory element being operative upon resumption of voltage to the supply line, or discontinuance of the operation of said control devices, to cause the bistable circuit to resume normal operation with conduction starting in that circuit portion which was conducting immediately prior to commencement of memory element programming.

2. A memory cell according to claim 1, wherein said control elements comprise transistors having a common connection joined to said voltage supply line, said connection including means for temporarily retaining a substantial portion of the supply line voltage level on said control elements when voltage to the supply line is interrupted, said transistors additionally including gates operably connected to a further supply line, said further line being associated with switching means responsibe to the interruption of the supply line voltage to ground the further supply line.

3. A memory cell according to claim 2, wherein said memory element comprises: drain and source electrodes connected respectively to drain and source electrodes of a further transistor included in said one circuit portion; a floating gate; and a programming gate connected to a circuit node in the other of said circuit portions.

4. A memory cell according to claim 3, wherein each portion of said bistable circuit further includes a load transistor and a driver transistor connected in series, the driver transistor of each one of the circuit portions having a gate joined to the series connection of the load and driver transistors of the outer circuit portion; and wherein the further transistors and said circuit node are positioned in their respective circuit portions between the series connection of the associated load and driver transistors and the associated control switch element.

5. A memory cell according to claim 4, wherein the load and driver transistors of said one circuit portion are respectively of shorter and longer length than the corresponding transistors of the other branch so as to make the bistable circuit asymmetric.

* * * * *